United States Patent
Muljono et al.

(10) Patent No.: US 6,995,552 B2
(45) Date of Patent: Feb. 7, 2006

(54) VOLTAGE MODULATOR CIRCUIT TO CONTROL LIGHT EMISSION FOR NON-INVASIVE TIMING MEASUREMENTS

(75) Inventors: Harry Muljono, Union City, CA (US); Stefan Rusu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 10/252,542

(22) Filed: Sep. 24, 2002

(65) Prior Publication Data

US 2003/0020448 A1 Jan. 30, 2003

Related U.S. Application Data

(62) Division of application No. 09/750,131, filed on Dec. 29, 2000, now Pat. No. 6,507,182.

(51) Int. Cl.
*G01R 19/00* (2006.01)
*G01R 23/12* (2006.01)
*G01R 23/175* (2006.01)

(52) U.S. Cl. ............... 324/76.11; 324/76.52; 324/76.54; 324/76.77

(58) Field of Classification Search .......... 324/76.11, 324/76.16, 76.52, 76.54, 76.77; 340/642, 340/956, 870.18, 870.25; 250/493.1, 503.1, 250/504; 438/14, 16, 17
See application file for complete search history.

(56) References Cited

U.S. PATENT DOCUMENTS

| | | | | |
|---|---|---|---|---|
| 3,922,570 A | * | 11/1975 | Eguchi et al. | 327/109 |
| 4,818,896 A | * | 4/1989 | Cavanna | 326/90 |
| 5,003,195 A | * | 3/1991 | Stelling et al. | 327/170 |
| 5,134,512 A | * | 7/1992 | Hiwada | 359/196 |
| 5,410,625 A | * | 4/1995 | Jenkins et al. | 385/28 |
| 5,457,561 A | * | 10/1995 | Taneya et al. | 398/120 |
| 5,768,449 A | * | 6/1998 | Fuse et al. | 385/1 |
| 5,784,091 A | | 7/1998 | Ema et al. | 347/131 |
| 5,940,545 A | * | 8/1999 | Kash et al. | 382/312 |
| 5,982,808 A | * | 11/1999 | Otto | 375/139 |
| 6,600,771 B1 | * | 7/2003 | Moon et al. | 375/130 |
| 6,693,416 B2 | * | 2/2004 | Roth | 324/76.77 |

* cited by examiner

*Primary Examiner*—Anjan Deb
*Assistant Examiner*—John Teresinski
(74) *Attorney, Agent, or Firm*—Kenyon & Kenyon

(57) ABSTRACT

An apparatus accurately measures the time difference between two signal edges by optically detecting the emission from a "beacon device" that is modulated as a function of time difference. Through the use of this modulation it is possible to perform timing measurement accurately. Embodiments of a voltage modulator circuit modulate timing information into emission intensity. The method and system of the present invention can be used in applications such as clock skew and pulse width measurements.

10 Claims, 5 Drawing Sheets

*Infra-red light is emitted when*
*Vds > Vgs-Vt (saturation)*

Voltage modulator circuit

Precharge phase

Modulating voltage as a function of timing skew

VOLTAGE MODULATOR CIRCUIT TO CONTROL LIGHT EMISSION FOR NON-INVASIVE TIMING MEASUREMENTS

This application is a divisional of application Ser. No. 09/750,131 filed Dec. 29, 2000 now U.S. Pat. No. 6,507,182.

FIELD OF THE INVENTION

Embodiments of the present invention relate to a voltage modulator circuit to control light emission for non-invasive timing measurements.

BACKGROUND OF THE INVENTION

Recent microprocessor designs use a flip-chip assembly to improve power distribution and achieve higher operating frequencies. Debug probing of such devices relies on what is known as Laser Voltage Probing (LVP). However, LVP technology cannot accurately measure edge delays for multi-GHz frequencies and the laser invasiveness is increasing with smaller transistor geometries.

To overcome these problems, methods to translate signal edge timing information into light emission that can be accurately measured using a Time-Resolved Emission (TRE) or InfraRed-Emission Microscope (IREM) have been proposed. These methods are based on the phenomenon that hot electrons in a saturated NMOS transistor (or beacon device) emit infrared radiation both under static bias and switching condition. See T. Eiles, et. al., "Optical Probing of Flip-Chip Packaged Microprocessors", *ISSCC Digest of Technical Papers*, pp. 220–221, February 2000, and L. T. Hoe, et. al., "Characterization and Application of Highly Sensitive Infra-Red Emission Microscopy for Microprocessor Backside Failure Analysis", *Proceedings of the 7th IPFA*, pp. 108–112, 1999. Thus, as indicated in FIG. 1, infra-red light is emitted from an NMOS transistor 10 when in saturation, i.e., Vds>Vgs–Vt.

J. C. Tsang et al., in "Picosecond hot electron emission from submicron complementary metal oxide semiconductor circuits," Appl. Phys. Lett., p.889–891, February 1997 describes using a commonly available, very low noise optical detector such as mercury cadmium telluride detector array, which has good sensitivity in the range of 0.9–1.45 μm, one can measure the emission intensity ($I_{emission}$) accurately. The use of light emission for time-dependent analysis is described by Dan Knebel et al. in "Diagnosis and Characterization of Timing-related Defects by Time-dependent Light Emission", *International Test Conference*, p. 733–739, August 1998. This paper describes clock skew analysis as one of many potential applications. In addition, it suggests the use of a phasedetector circuit (PFC) to modulate the duration of light pulse as a function of skew.

Thus, as shown in FIG. 2, in the prior art, a Phase-Frequency Comparator (PFC) 11 is used to focus the mode of operation on one particular edge (i.e. rising edge) for which a timing delay Δt is to be measured. The PFC is coupled to a saturated NMOS transistor (or beacon device) 13 which emits infrared radiation. The radiation is then detected by a photon detector 15, which may be a TRE or IREM as noted above. The resulting measured pulse, has a width representing Δt.

However, we have found that this method is limited by a 'deadband region' where, if the skew is less than the rise/fall time of the clock under test, it will go undetected. A need, therefore, exists for a method and apparatus which overcomes this limitation.

DETAILED DESCRIPTION

Embodiments of methods and systems for measuring timing information through the use of light emission from a semiconductor are described. In the following description, for purposes of explanation, numerous specific details are set forth to provide a thorough understanding of the present invention. It will be appreciated, however, by one skilled in the art, that the present invention may be practiced without these specific details. In other instances, structures and devices are shown in block diagram form. Furthermore, one skilled in the art can readily appreciate that the specific sequence in which methods are presented and performed are illustrative and it is contemplated that the sequences can be varied and still remain within the spirit and scope of the present invention.

Embodiments of the present invention provide a novel, non-invasive method and system to accurately measure the time difference between two signal edges. This is accomplished by optically detecting the emission from a 'beacon device' that is modulated as a function of time difference. Through the use of this modulation it is possible to perform timing measurement accurately. The system for doing this includes embodiments of a voltage modulator circuit to modulate timing information into emission intensity. The method and system of the present invention can be used in applications such as clock skew and pulse width measurements would benefit from the new technique.

Figure 3:
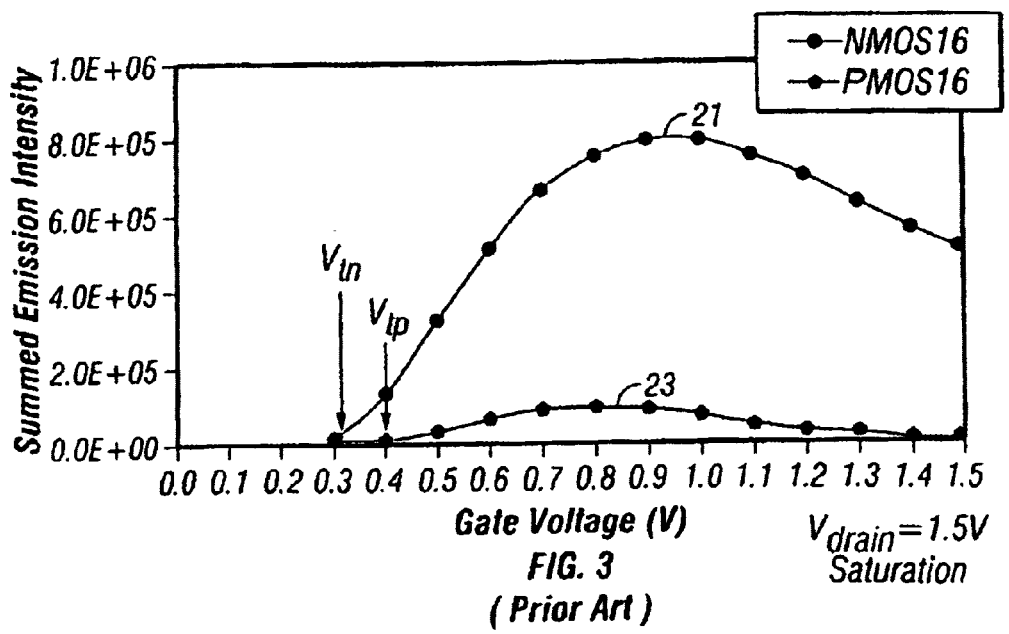
FIG. 3 is graph plotting intensity vs. gate voltage for a beacon transistor such as that of FIG. 1.
Figure 4:
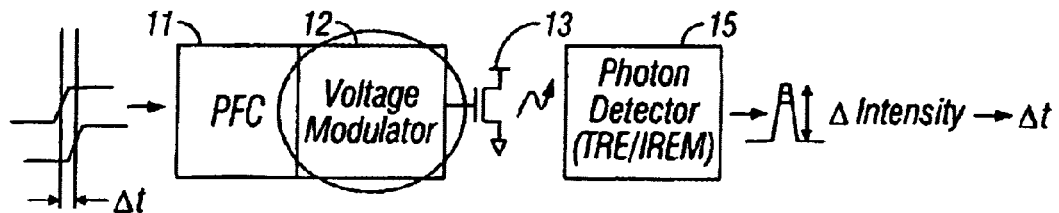
FIG. 4 is a block diagram of an embodiment of the present invention for measuring timing information through the use of light emission from a semiconductor.

Experimental measurements have shown that the light emission from a saturated NMOS device has an exponential relationship with the gate voltage, Vgs as shown in FIG. 3. Illustrated is a curve 21 for an NMOS transistor and a curve 23 for a PMOS transistor. The present invention employs this dependency to accurately translate the timing difference between two signal edges into a Vgs voltage level, thus modulating the $I_{emission}$. Specifically, the timing difference is first converted to a voltage level Vgs. The voltage level Vgs is then used drive a beacon device, the emission of which can be measured. Timing information is extracted by measuring photon counts (photon detector output) which is linearly proportional to $I_{emission}$. Thus, as shown in FIG. 4, in accordance with an embodiment of the present invention, the PFC 11 is followed by a modulator 12 which drives the beacon transistor 13. Now the output pulse, which has an amplitude proportional to emission intensity, provides a measure of timing difference Δt.

Thus, in accordance with embodiments of the present invention, to translate skew timing information into a Vgs voltage level, a voltage modulator circuit is required. The circuit will be incorporated into the die under test. However, an embodiment of such a circuit according to the present invention, has small area and loading and does not disturb the operation of the circuit being probed. As described in the aforementioned publications, backside emission from the die is measured. Since embodiments of the present invention measure only the light emitted from the device, this method is completely non-invasive and will scale well for smaller device geometries (below 100 nm).

Figure 5:
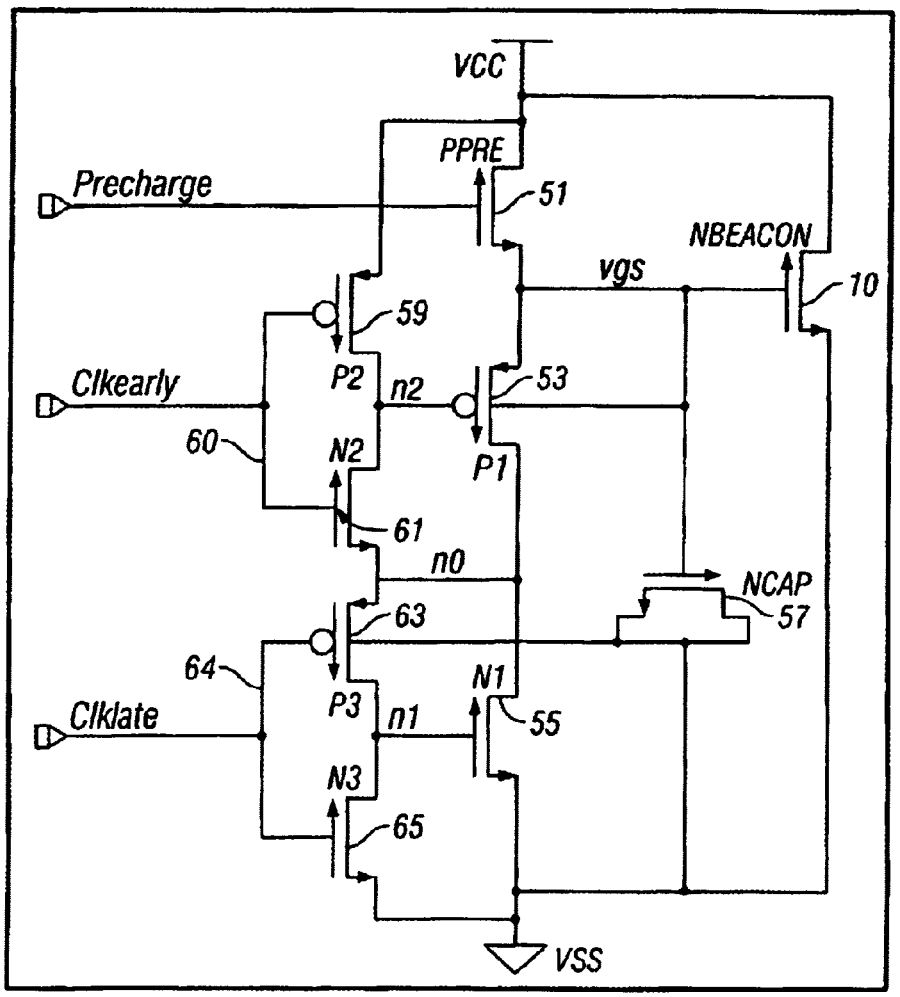
FIG. 5 is a circuit diagram of a modulator according to an embodiment of the present invention.

An embodiment of such a circuit is shown in FIG. 5. It includes a series circuit extending between Vcc and ground made up of an NMOS precharge device PPRE 51, two qualifying devices, a PMOS device 53 and an NMOS device 55. The junction between device 51 and device 53 is coupled to one terminal of a capacitor NCAP 57 which has its other terminal coupled to ground. The gate of device 51 is driven by a "precharge" signal. Each of devices 53 and 55 is driven by an switching device. Device 53 is driven by an switching device 60 made up of PMOS device 59 and NMOS device 61. Device 55 is driven by an switching device 64 made up of PMOS device 63 and NMOS device 65. Switching device 60 is driven by a signal "CLKEarly" and switching device 64 by a signal "CLKLate." The are the two signal, the delay or skew between which is to be measured. The gate of the beacon transistor 10 is coupled the gate of NCAP 57 and the junction between the drain of device 51 and the source of device 53.

Figure 6:
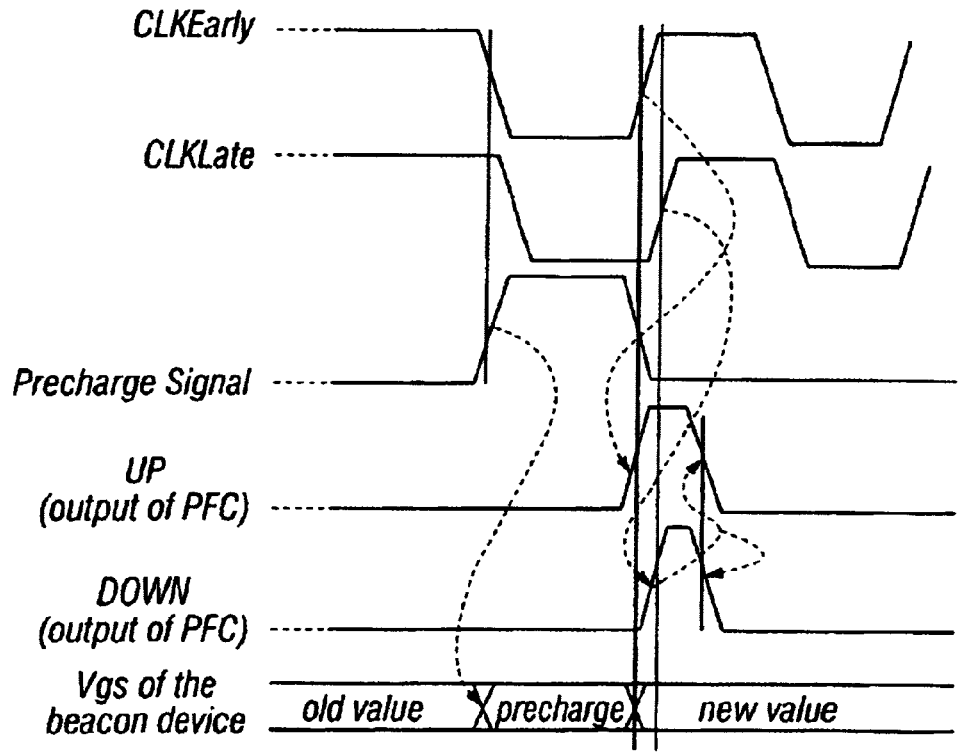
FIG. 6 is a timing diagram for the embodiment of FIG. 5.
Figure 7A:
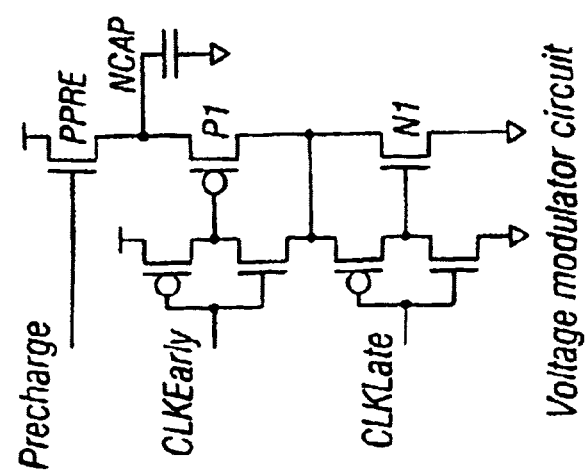
FIGS. 7a–7c are circuit diagrams showing operation of a modulator circuit for an embodiment of a circuit according to FIG. 5.
Figure 7B:
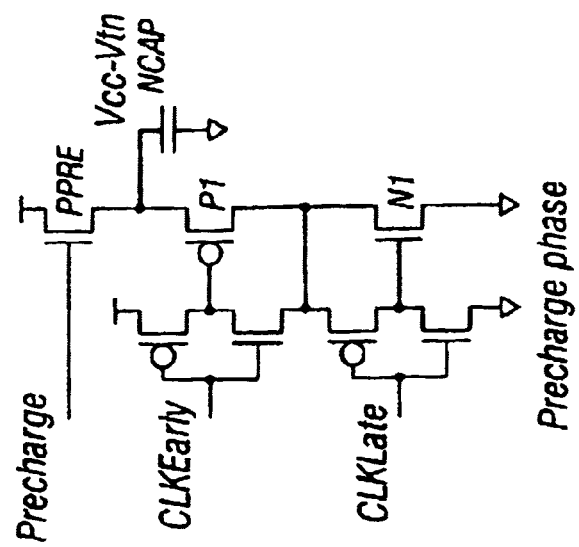
Figure 7C:
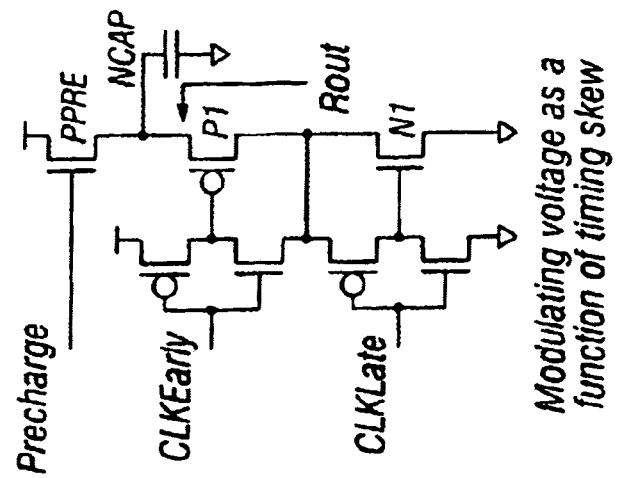

FIG. 6 shows the timing waveforms for the embodiment of the circuit of FIG. 5. FIGS. 7a–c repeat the modulator portion of FIG. 5 and are helpful, along with FIG. 6 in understanding the operation of the circuit. FIG. 7a is the modulator circuit by itself. In operation, first, the capacitor 57 is precharged to (Vcc−Vtn) through device 51, when CLKEarly is low. This is illustrated in FIG. 7b, where the dark lines show the part of the circuit active during precharge. At this point, as FIG. 3 suggests, the pre-charged Vgs line (=Vcc−Vtn) sets the emission intensity to a maximum.

Device 55 turns on when the CLKLate signal is low. As the CLKEarly signal goes high, device 53 switches ON, developing a conductive path between the capacitor and ground. The active parts of the circuit now are shown in dark lines in FIG. 7c. Now the capacitor begins discharging the gate voltage, and with it the intensity decreases. The conduction lasts until CLKLate goes high. The difference between the time when CLKEarly goes high and the time when CLKLate goes high is the time difference or skew to be measured. Thus, it is apparent that the longer this time, the more the discharge and the lower the intensity. Thus, effectively the modulator converts a time difference, such as a skew into a value of voltage Vgs. As is explained in more detailed below, this voltage is then used, in combination with the known relationship between Vgs and intensity plotted in FIG. 3, to obtain a linear relationship between intensity, which can be measured as indicated in FIG. 4, and timing difference or skew.

As illustrated by the embodiment of FIG. 4, it is possible to also use a Phase-Frequency Comparator (PFC) to focus the mode of operation on one particular edge (i.e. rising edge). In this case the two outputs of PFC (UP and DOWN) replaces CLKEarly and CLKLate signals as indicated on FIG. 6.

Since the qualifying devices 53 and 55 are operating in saturation, the current (Ids) is proportional to the square of the capacitor voltage.

$$I_{ds} = \beta_1(V_{gs1}/2)^2(1+\lambda V_{ds1}) = \beta_2(V_{gs2}/2)^2(1+\lambda V_{ds2}) \quad \text{(equation 1)}$$

For very small number of $\lambda$, Ids $\alpha V_{gs1}^2 \alpha V_{gs2}^2$
where the subscript 1 represents device 53 of FIG. 5 and subscript 2 represents device 55 in the same figure.

Thus, $R_{ds1} = V_{gs1}/I_{ds1} \alpha V_{gs1}/V_{gs1}^2 = 1/V_{gs1}$

Likewise $R_{ds2} \alpha 1/V_{gs2}$ \quad (equation 2)

Figure 1:
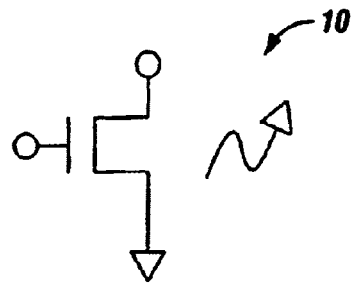
FIG. 1 is a schematic diagram of a beacon transistor of the prior art which is used in embodiments of the method and apparatus of the present invention.
Figure 2:
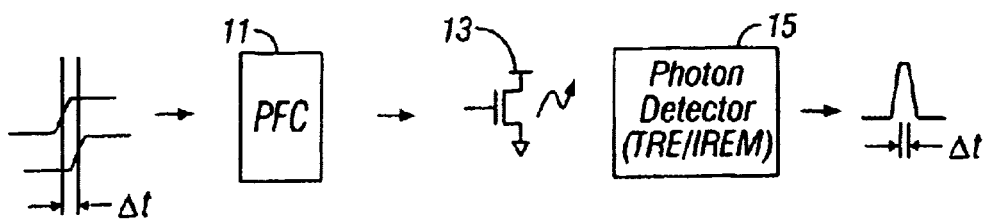
FIG. 2 is a block diagram of a prior art arrangement for measuring timing information through the use of light emission from a semiconductor.
Figure 8:
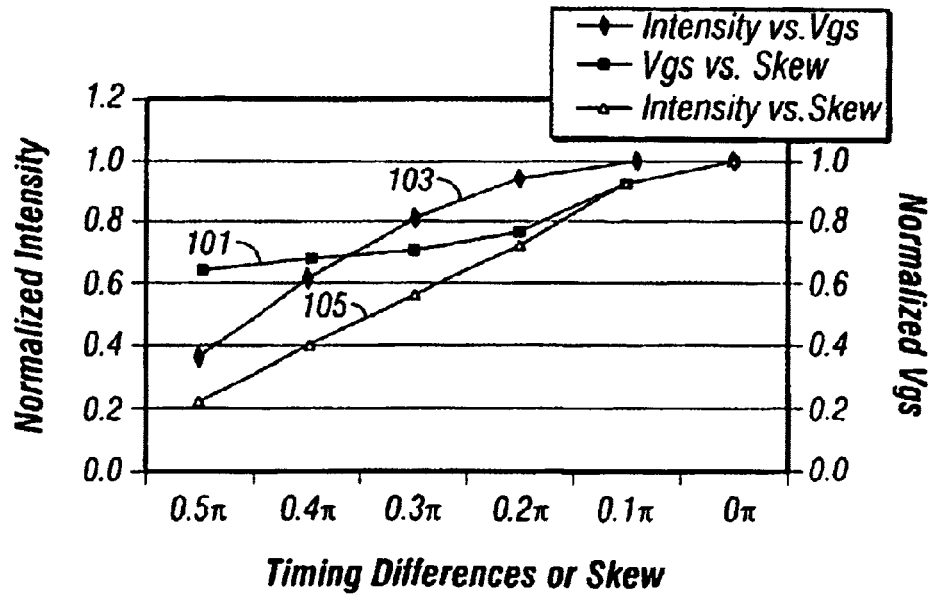
FIG. 8 is showing timing skew vs. intensity and gate voltage and intensity vs. gate voltage for embodiments of the method and apparatus of the present invention.
Figure 9A:
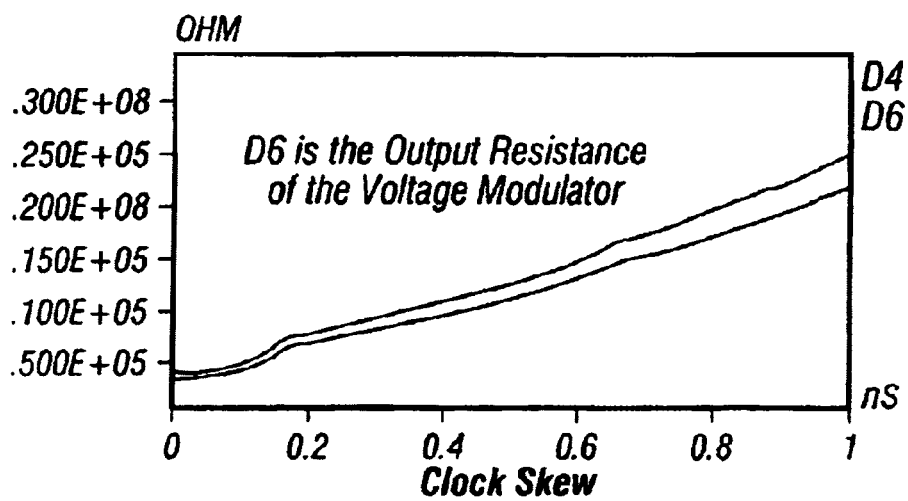
FIGS. 9A–C shows the relationship between resistance, current, voltage and clock skew.
Figure 9B:
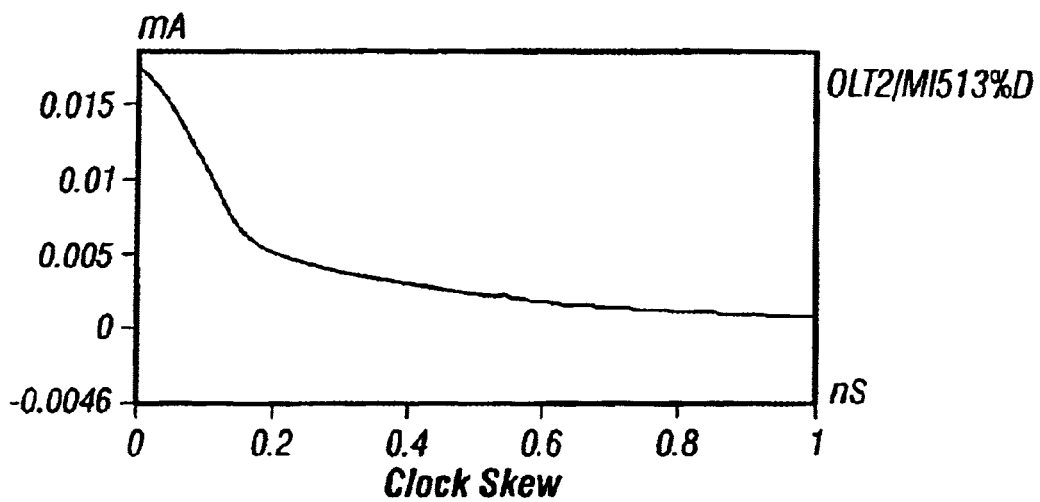
Figure 9C:
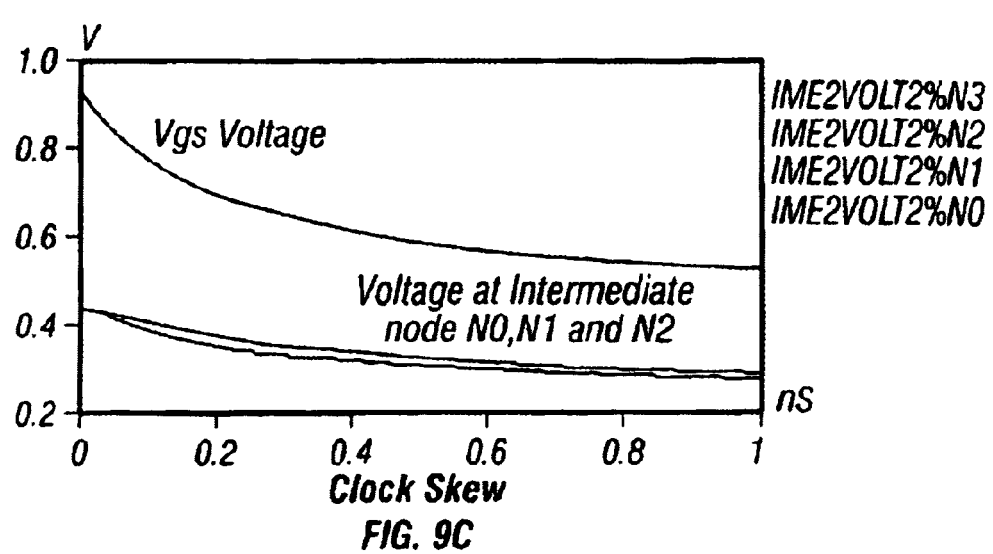

The exponential behavior of $I_{emission}$ vs. $V_{gs}$ represented by circle points in FIG. 8 is compensated by the inverse relationship between $V_{gs}$ and $R_{ds}$ shown in FIG. 2. With $R_{ds}$ linearly proportional to skew, the linear relationship between $I_{emission}$ and skew is guaranteed. These relationships are evident from the graphs of FIGS. 8 and 9a–9c. FIG. 9a shows the relationship between $R_{ds}$ and clock skew. The linear relationship is apparent. FIG. 9b shows the relationship between Ids and clock skew. Finally, FIG. 9c shows the relationship between the Vgs voltage and clock skew. Also shown is the voltage at nodes n0, n1 and n2 of FIG. 5.

Turning to FIG. 8, three curves are plotted. First, timing difference or skew vs. gate voltage is plotted as curve 101. This is the same relationship as shown in FIG. 7c. Intensity vs. gate voltage is plotted as curve 103. This corresponds to curve 21 of FIG. 3. From these, the relationship of intensity vs. skew is obtained and plotted as curve 105. Again, the linearity is apparent. The non-linearity of the skew vs. gate voltage has compensated for the non-linearity in the intensity vs. gate voltage relationship. It can be seen that with no timing difference measured, Vgs and intensity are at their normalized value of 1. As time increases, and the capacitor 57 of FIG. 5 discharges, Vgs, and with it intensity decreases. The larger the time difference, the more the decrease as shown by curve 105 of FIG. 8. Thus, with embodiments of the modulator of the present invention, it is possible to determine the timing difference or skew by means of measuring the intensity of the emission from the beacon transistor.

In summary, the voltage modulator according to embodiments of the present invention has two functions:
1. to convert a time difference which may be skew timing information into a Vgs voltage level controlling a beacon device; and
2. to linearize the relationship between $I_{emission}$ response and skew.

By doing this, the 'deadband region' of the prior art is avoided. Furthermore, there is no perturbation to clock operation due to small area and loading, a linear relationship between $I_{emission}$ and skew is maintained avoiding distortion due to non-linearity. As noted above embodiments of the present invention also scale well for smaller device geometries (below 100 nm).

Embodiments of a method and apparatus to translate timing differences into emission intensity have been described. In the foregoing description, for purposes of explanation, numerous specific details are set forth to provide a thorough understanding of the present invention. It will be appreciated, however, by one skilled in the art that the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of the present invention.

In the foregoing detailed description, apparatus and methods in accordance with embodiments of the present invention have been described with reference to specific exemplary embodiments. Accordingly, the present specification and figures are to be regarded as illustrative rather than restrictive.

What is claimed is:

1. Non-invasive apparatus to accurately measure the time difference between two signals having edges delayed with respect to one another comprising:
    a. a voltage modulator circuit to receive the two signals as inputs and providing an output voltage modulated with said timing difference; and
    b. a beacon device to receive the output voltage of said modulator circuit and converting it into an emission intensity.

2. Non-invasive apparatus to accurately measure the time difference between two signals according to claim 1 wherein said time difference is a time difference between two timing signals.

3. Non-invasive apparatus to accurately measure the time difference between two signals according to claim 1 wherein said time difference is a clock skew.

4. Non-invasive apparatus to accurately measure the time difference between two signals having edges delayed with respect to one another comprising:
    a voltage modulator circuit to receive the two signals as inputs and providing an output voltage modulated with said timing difference; and
    a beacon device to receive the output voltage of said modulator circuit and converting it into an emission intensity; wherein
    said modulator circuit comprises:
        a. a capacitor to supply said modulated output;
        b. a precharge transistor which when actuated couples said capacitor with a supply voltage to precharge it to that voltage; and
        c. a discharge circuit coupled to discharge said capacitor for a period equal to said time difference between two signals.

5. Non-invasive apparatus to accurately measure the time difference between two signals according to claim 4 wherein the relationship between said output voltage and said time difference is non-linear and said beacon device has a characteristic relationship between voltage and emission intensity which compensates for said non-linear relationship.

6. Non-invasive apparatus to accurately measure the time difference between two signals according to claim 5 wherein said beacon device comprises a saturated NMOS transistor.

7. Non-invasive apparatus to accurately measure the time difference between two signals according to claim 5 wherein said precharge transistor comprises an NMOS transistor having a source coupled to the supply voltage, a drain coupled to a terminal of said capacitor and a gate, the capacitor having another terminal coupled to ground.

8. Non-invasive apparatus to accurately measure the time difference between two signals according to claim 5 wherein said discharge circuit comprises a series circuit made up two qualifying devices, a PMOS device and an NMOS device, the PMOS device driven by a first of said two signal and the NMOS device driven by a second of said two signals, said PMOS device coupled to one terminal of said capacitor.

9. Non-invasive apparatus to accurately measure the time difference between two signals according to claim 8 wherein said first signal is a "CLKEarly" signal and said second signal is a "CLKLate" signal.

10. Non-invasive apparatus to accurately measure the time difference between two signals according to claim 8 and further including first and second switching devices respectively between said PMOS device and said NMOS device and said first and second signals.

* * * * *